United States Patent

Kamikawa et al.

[11] Patent Number: 6,029,371
[45] Date of Patent: Feb. 29, 2000

[54] DRYING TREATMENT METHOD AND APPARATUS

[75] Inventors: Yuji Kamikawa, Koshi-machi; Teruomi Minami, Kurume; Shigenori Kitahara, Chikugo, all of Japan

[73] Assignee: Tokyo Electron Limited, Tokyo, Japan

[21] Appl. No.: 09/156,751

[22] Filed: Sep. 16, 1998

[30] Foreign Application Priority Data

Sep. 17, 1997 [JP] Japan .................................. 9-269214

[51] Int. Cl.$^7$ ........................................................ F26B 3/00
[52] U.S. Cl. ............................................. 34/516; 34/92
[58] Field of Search .................................. 34/92, 76, 516, 34/517

[56] References Cited

U.S. PATENT DOCUMENTS

| | | | |
|---|---|---|---|
| 5,315,766 | 5/1994 | Roberson, Jr. et al. | 34/409 |
| 5,571,337 | 11/1996 | Mohindra et al. | 134/25.4 |
| 5,855,077 | 1/1999 | Nam et al. | 34/409 |

*Primary Examiner*—Henry Bennett
*Assistant Examiner*—Malik N. Drake
*Attorney, Agent, or Firm*—Graham & James LLP

[57] ABSTRACT

A drying treatment apparatus for drying cleaned semiconductor wafers comprises drying gas producing means (41) connected to a drying treating unit (30) through a drying gas supplying pipe line (32). A flowrate controlling diaphragm pump (50) is provided in an isopropyl alcohol (IPA) supplying pipe line (32) that connects an IPA tank (48) and the drying gas producing means (41). An $N_2$ gas supply source (52) is provided for supplying nitrogen gas into the drying gas producing means (41), and a heater (44) is disposed within the drying gas producing means to produce a drying gas. As a result of this, the amount of the IPA supplied to the drying gas producing means (41) by the diaphragm pump (50) is controllable, thus enabling the concentration of the IPA contained in the drying gas to be maintained at a value within a range of from 3% to 80%, inclusive, and enabling the temperature of the drying gas to be maintained at a value within a range of from 80° to 150°, inclusive, due to the heating by the heater (44). The above feature enables improvement of the drying efficiency and reduction in the amount of consumption of the drying gas.

11 Claims, 7 Drawing Sheets

DRYING TREATMENT METHOD AND APPARATUS

BACKGROUND OF THE INVENTION

1. Field of the Invention

The present invention relates to a dry treatment method and apparatus for causing an object to be treated such as a semiconductor wafer or LCD glass substrate to contact with a drying gas to thereby dry the object.

2. Description of the Related Art

Generally, in the process of manufacturing a semiconductor in a semiconductor manufacturing apparatus, there is widely adopted a method of immersing the surface of an object to be treated such as a semiconductor wafer or LCD glass substrate (hereinafter referred to as "a wafer") in a chemical liquid, rinsing liquid (cleaning liquid) and the like by the use of a cleaning treatment apparatus to thereby perform a cleaning treatment with respect thereto and thereafter drying the cleaned wafer by the use of a dry treatment apparatus.

Conventionally, as this type of drying treatment apparatus, there is known an apparatus which is equipped, at a low side thereof communicated with a drying treatment section, with a drying gas producing means for heating a volatile organic solvent such as IPA (isopropyl alcohol) and thereby generating a vapor thereof. The IPA gas as a drying gas is caused to contact with an object to be treated such as a cleaned wafer that has been accommodated within the drying treatment section. The vapor of the drying gas is then condensed and any moisture on the object is removed, whereby the object is dried. In this type of drying treatment method, the degree of drying is greatly affected by the concentration of the drying gas or the degree of contact of the drying gas with the object.

In this type of conventional drying treatment apparatus, the drying gas producing section and the drying treatment section are located in the same zone, so that the state of the drying gas produced in the drying gas producing section tends to be affected by the condition within the drying treatment section. For this reason, heat is taken away by the cleaned object to be treated which is at a low-temperature, with the result that the vaporization of the organic solvent is suppressed. Furthermore, the heat of the vapor that has been obtained by the vaporization is taken away in the vicinity of the object to be treated, so that the temperature of the vapor is lowered and the vapor is condensed. Therefore, there occurs a state in which no drying gas exists within the drying treatment section or a state in which the concentration of the drying gas is very low even if the drying gas exists, giving rise to a problem that the drying efficiency becomes low. If the drying gas continues to be produced in spite of the above-mentioned state, the amount of consumption of the organic solvent will increase undesirably.

SUMMARY OF THE INVENTION

The present invention has been made in view of the above-described circumstances and has an object to provide a drying treatment method and apparatus which can control the amount of generation as well as the concentration and temperature of the drying gas and can prevent the condensation of the solvent in the drying gas during the drying operation, thereby increasing the drying efficiency and enabling decrease in the amount of consumption of the solvent.

To attain the above object, according to an aspect of the present invention there is provided a drying treatment method which comprises the steps of: mixing and heating a solvent and an inert gas to produce a drying gas; and supplying said drying gas into a drying treatment chamber and causing the drying gas to contact an object to be treated, contained in the drying treatment chamber, to dry the object; wherein said solvent has a concentration in the drying gas in a range of 3 to 80% and the drying gas has a temperature of from 80 to 150° C.

According to another aspect of the present invention, there is provided a drying treatment apparatus which comprises: drying treatment means having a drying treatment chamber containing an object to be treated; a solvent supply source; an inert gas supply source; drying gas producing means including a mixing unit for mixing a solvent and an inert gas, and a heating unit for receiving a mixed gas of the solvent and the inert gas and for heating the mixed gas to produce a drying gas; a solvent supply pipe line connecting said solvent supply source to the mixing unit; a flowrate-controllable solvent feed means provided in the solvent supply pipe line; an inert gas supply pipe line connecting the inert gas supply source to the mixing unit; a drying gas supply pipe line connecting the drying gas producing means to the drying treatment chamber to send the drying gas into the drying treatment chamber; the solvent feed means being set to produce such a flowrate of the solvent which causes a concentration of the solvent in the drying gas to be maintained in a range of from 3 to 80%; and said heating unit being set to maintain the drying gas in a range of from 80 to 150° C.

The nozzle in the drying treatment chamber may be stationary but preferably be movable relative to the object to be treated.

The drying treatment chamber may be connected to an exhaust pipe line in which an exhaust means for pressure reduction is provided. More preferably, the exhaust means should operate to carry out pressure reduction as gently as possible at the time of start and end of the pressure reduction.

A heater may be provided outside the drying treatment chamber, to prevent condensation of the drying gas.

A discharge pipe may be connected to the drying treatment chamber and a gas/liquid separation unit may be provided to the discharge pipe, to separate the solvent in a used drying gas from the inert gas. Any type of the gas/liquid separation unit may be used if it has the above function. Preferably, the gas/liquid separation unit may include a drying gas chamber for receiving a used drying gas, cooling means for condensing the solvent contained in the drying gas, a solvent discharge port provided at a bottom of the drying gas chamber to discharge the condensed solvent, and an inert gas exhaust port provided at a side of the drying gas chamber to discharge the separated inert gas.

According to the present invention, the drying gas producing means and the drying treatment means are located in separate areas so that the drying gas is influenced to only a small degree by the conditions of the object to be treated and by the conditions within the drying treatment means. Furthermore, the flowrate of the solvent supplied from the solvent supply source can be adjusted by the use of the solvent feed means so that the amount of solvent vapor produced can be controlled. Consequently, the concentration of the solvent in the drying gas can be adjusted to a suitable range of from 3 to 80%, and the temperature of the drying gas can be maintained to a suitable range of from 80 to 150° C. by means of the heating unit. Therefore, the drying efficiency can be improved, and the drying gas and the solvent can be used effectively whereby the amount of consumption of the solvent is reduced.

The nozzle for supplying the drying gas may be made movable relative to the object to be treated whereby the drying gas can be made to contact the object entirely and uniformly so that non-uniform drying operation does not occur and the drying efficiency is improved.

If the drying treatment chamber is reduced in pressure by means of pressure reducing means, after the supply of the drying gas, condensation of the solvent can be prevented and the drying efficiency is further increased. It is desirable that the pressure reduction be performed as gently as possible at the time of start and end of the pressure reducing operation. This prevents an adverse influence on the object to be treated and an excessive outflow of the drying gas due to abrupt pressure change.

By providing a heating unit outside the drying treatment chamber, condensation of the solvent contained in the drying gas, due to temperature drop during the drying treatment, can be prevented, whereby the drying operation is promoted and the amount of consumption of the solvent is reduced.

Furthermore, if a gas/liquid separation unit is provided in a discharge pipe connected to the bottom of the drying treatment chamber, the solvent in the used drying gas and the inert gas can be separated from each other, whereby atmospheric pollution can be prevented.

DESCRIPTION OF THE PREFERRED EMBODIMENTS

Embodiments of the present invention will now be described hereafter in detail with reference to the accompanying drawings. The description will be given of a case where the invention is applied to a cleaning treatment system for cleaning semiconductor wafers.

Figure 1:
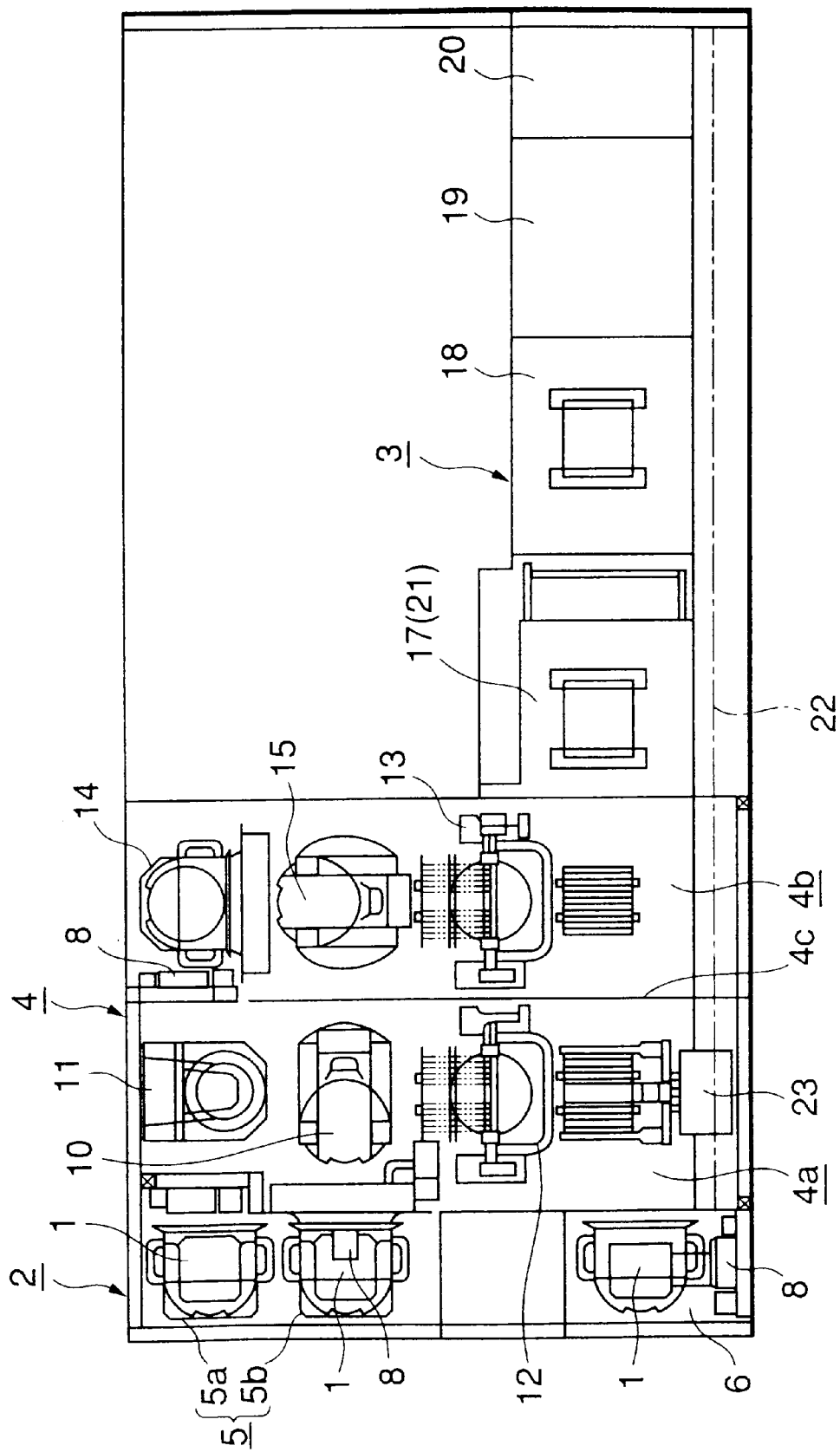
FIG. 1 is a schematic plan view illustrating a cleaning and drying treatment system to which a drying treatment apparatus according to the present invention is applied.
Figure 2:
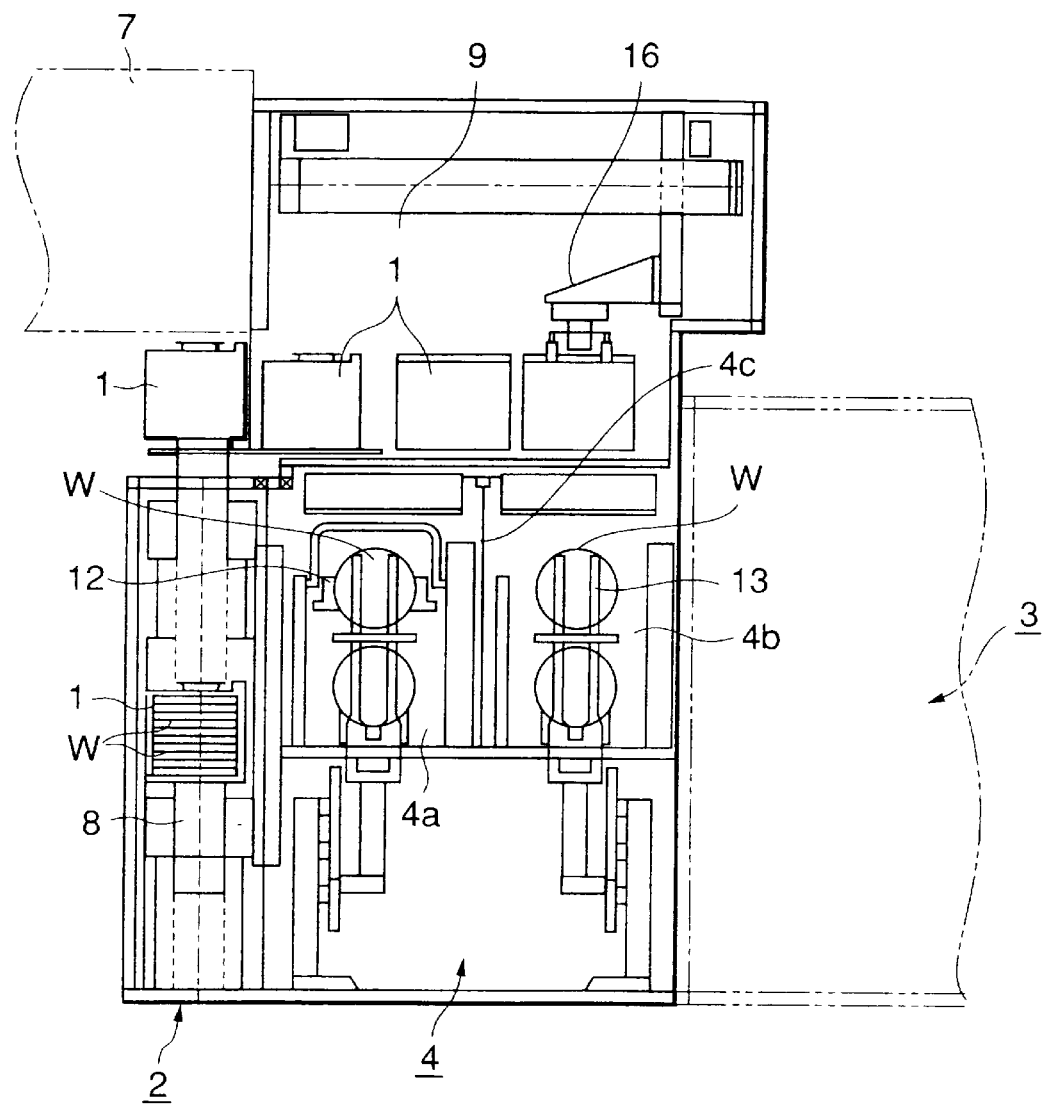
FIG. 2 is a schematic side view of FIG. 1.

FIG. 1 is a schematic plan view illustrating an example of the cleaning treatment system to which the drying treatment apparatus according to the present invention is applied, and FIG. 2 is a schematic side view illustrating a part of FIG. 1.

The cleaning treatment system is comprised mainly of a conveying section 2 to and from which a container, such as a carrier 1, for accommodating therein semiconductor wafers W (objects to be treated) in a horizontal state is conveyed, a treating section 3 for liquid-treating the wafer W with the use of a chemical liquid, a cleaning liquid or the like and for drying the wafers W, and an interface section 4 which is located between the conveying section 2 and the treating section 3 and in which delivery, positional adjustment and attitude change operations of the wafers W are performed.

The conveying section 2 is comprised of an inlet part 5 and an outlet part 6 which are juxtaposed at one end of the cleaning treatment system. The inlet part 5 is comprised of a receiving portion 5a for receiving the carrier 1 from an upper conveying mechanism 7 (FIG. 2) and a delivering portion 5b for receiving thereon the carrier 1 conveyed from the receiving portion 5a horizontally. On the delivering portion 5b there is disposed a carrier lifter 8 (FIG. 2) for conveying the carrier 1 between an upper position and a conveying-in port (not illustrated) of the interface section 4. Also, on the outlet part 6 there is disposed a carrier lifter 8 for conveying the carrier 1 between a conveying-out port (not illustrated) of the interface section 4 and an upper zone. By the use of these carrier lifters 8, it is possible to convey the carrier 1 within the inlet part 5 and outlet part 6 and it is also possible to deliver an empty carrier 1 to a carrier waiting part 9 provided at an upper zone of the interface section 4 and, as indicated in FIG. 2, to receive the empty carrier 1 from the carrier waiting part 9.

The interface section 4 is comprised of a first compartment 4a adjacent to the conveying section 2 and a second compartment 4b adjacent to the treating section 3, the first compartment 4a and the second compartment 4b being partitioned by a partitioning wall 4c. And within the first compartment 4a there are disposed a wafer take-out arm 10 which is movable in the horizontal direction (X and Y directions) and vertical direction (Z direction) and rotatable (in the θ direction) and which is intended to take out and convey a plurality of wafers W from the carrier 1 of the inlet part 5 (specifically, the delivering portion 5b), a notch aligner 11 for aligning the notches each formed in the wafer W, a gap adjusting mechanism (not illustrated) for adjusting the gaps between the plurality of wafers W taken out by the wafer take-out arm 10, and a first attitude changing device 12 for changing the state of the wafer W from a horizontal state to a vertical state.

Also, within the second compartment 4b, there are disposed a second attitude changing device 13 for changing from the vertical state to the horizontal state the wafers W received from a wafer conveying arm 23 as later described, the wafer conveying chuck 23 being intended to convey a plurality of treated wafers W from the treating section 3 in a state wherein these wafers W are kept vertical, and a wafer accommodating arm 15 which is movable in the horizontal direction (X and Y directions) and vertical direction (Z direction) and rotatable (in the θ direction) and which is intended to receive from the second attitude changing device 13 the plurality of wafers W whose attitude has been changed to the horizontal state by this second attitude changing device 13 and to accommodate these wafers W into the empty carrier 1 which has been conveyed up to a wafer receiving part 14. It is to be noted that on the wafer receiving part 14 there is provided a carrier lifter 8 for conveying the carrier between the wafer receiving part 14 and the carrier waiting part 9. Furthermore, in the carrier waiting part 9 there is disposed a carrier conveying robot 16 for moving to a prescribed waiting position the empty carrier 1 whose wafers W are already delivered by the wafer delivering portion 5b or the carrier 1 having the wafers W accommodated therein in the wafer receiving part 14, or for moving to above the outlet part 6 the wafer W accommodated carrier 1 that has been conveyed from the wafer receiving part 14 to the carrier waiting part 9.

On the other hand, in the treating section 3, there are disposed in a linear arrangement a first treating unit 19 for removing particles or organic contaminants adhered onto the wafers W, a second treating unit 18 for removing metallic contaminants adhered onto the wafers W, a third treating unit 17 for removing oxide films adhered onto the wafers W and a chuck cleaning unit 20. It is to be noted that a drying unit 21 is disposed above the third treating unit 17. In this case, a drying treatment apparatus according to the present invention is applied to the drying unit 21. The above mentioned wafer conveying arm 23 is movable in the X and Y directions (the horizontal directions) and Z direction (the vertical direction) and rotatable (in the θ direction). The wafer conveying arm 23 is disposed on a conveying passage 22 provided in such a way as to extend from the position opposing the respective units 17 to 20 to the interface section 4.

Next, the drying treatment apparatus according to the present invention will be described.

First Embodiment

Figure 3:
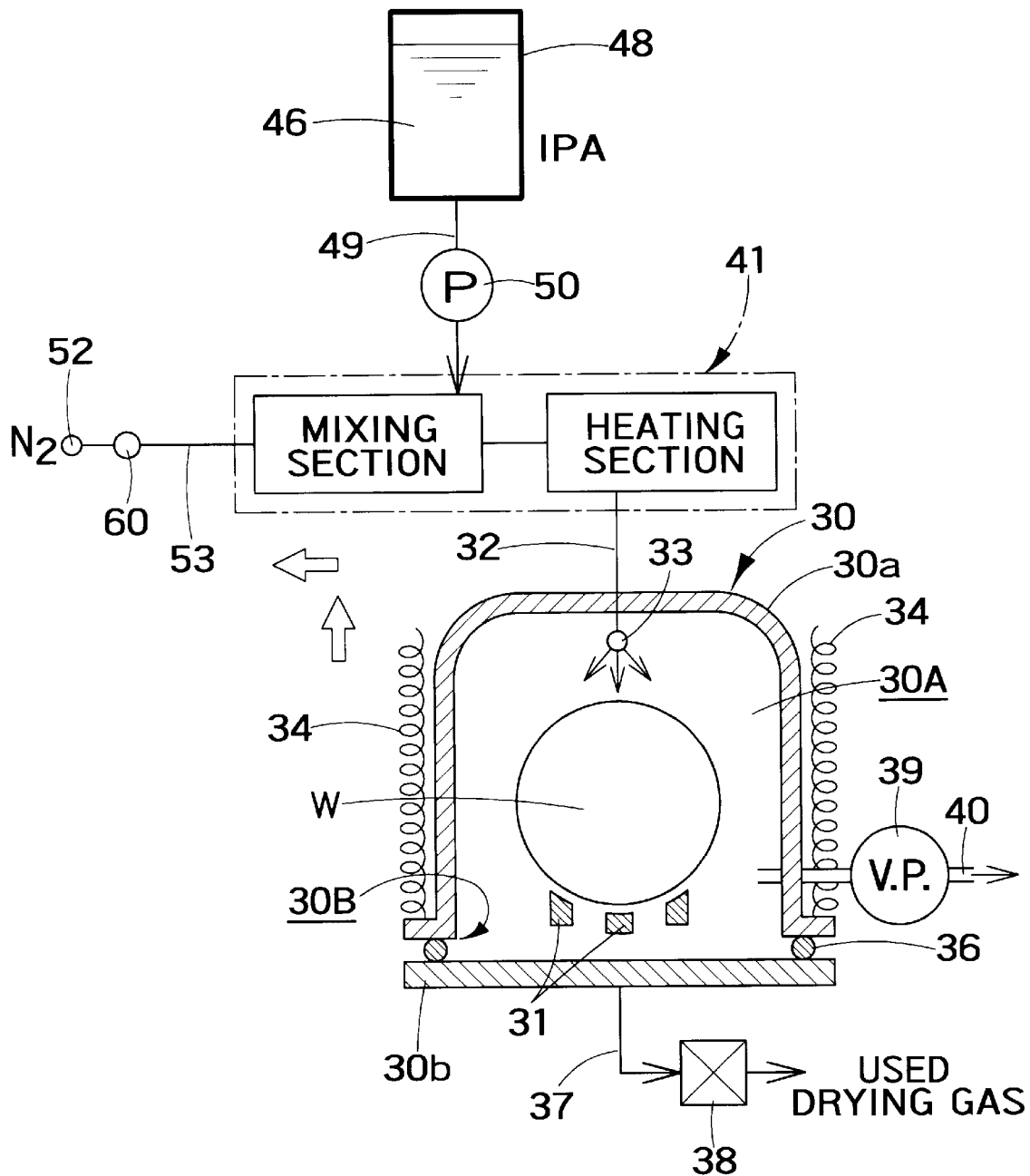
FIG. 3 is a schematic view illustrating a first embodiment of the drying treatment apparatus according to the present invention.
Figure 4:
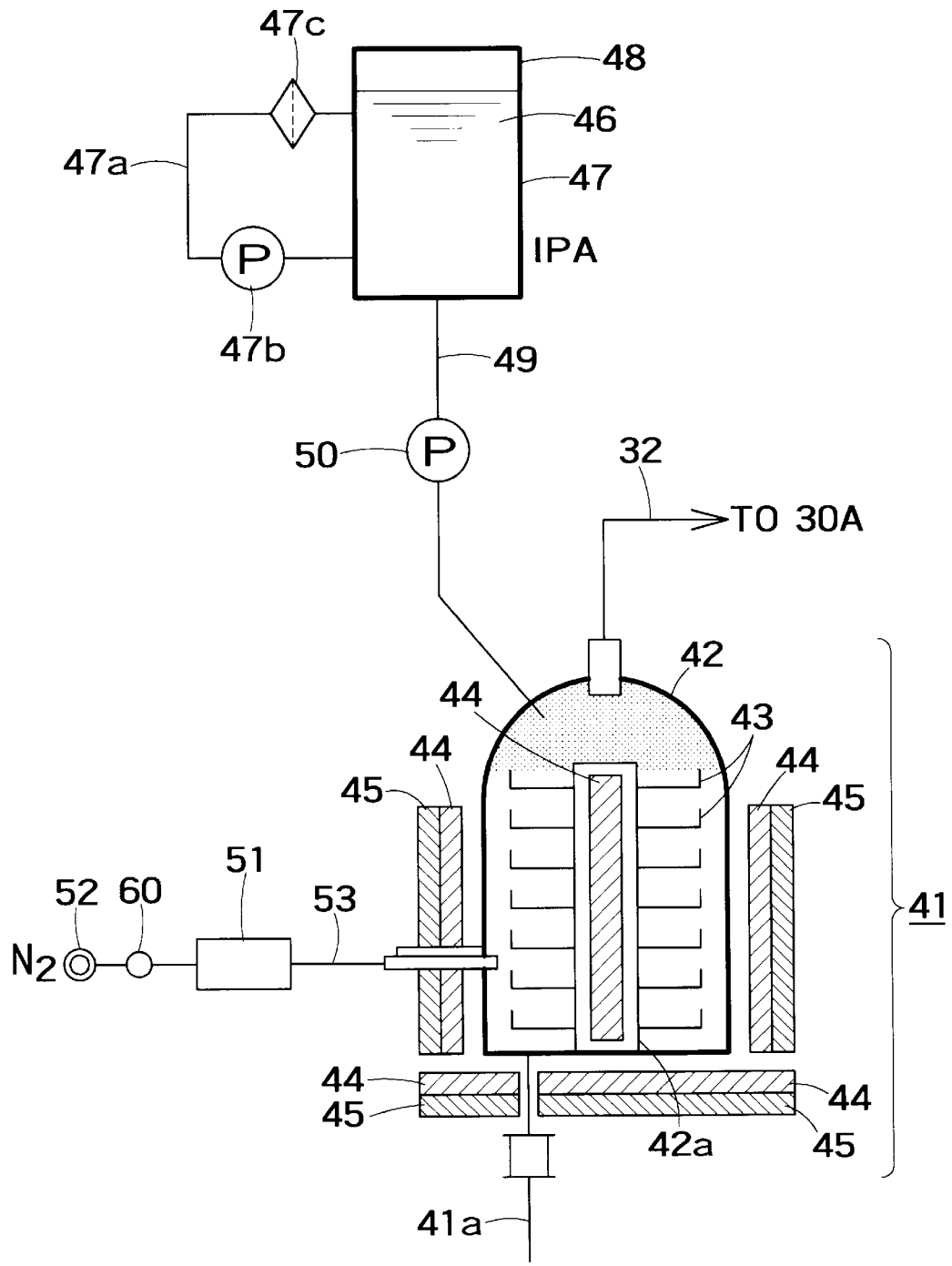
FIG. 4 is a schematic sectional view illustrating an example of the drying gas producing means of the drying treatment apparatus according to the present invention.

FIG. 3 is a schematic view illustrating a first embodiment of the drying treatment apparatus according to the present invention and FIG. 4 is a schematic sectional view illustrating an example of drying gas producing means constituting a part of the drying treatment apparatus according to the present invention.

The drying treatment apparatus is comprised mainly of a drying treating unit 30 having a treating chamber 30A for drying wafers W, a drying gas producing unit (drying gas producing means) 41 connected to the treating chamber 30A through a drying gas (a gaseous mixture of an organic solvent and an inert gas) supplying pipe line 32, a tank (organic solvent supplying means) 48 for an organic solvent, e.g. IPA (isopropyl alcohol) connected to the drying gas producing unit 41 through a supply pipe line 49, and a nitrogen ($N_2$) gas supply source (inert gas supplying means) 52 which serves to supply the drying gas to the treating chamber 30A and supplies the inert gas such as $N_2$ gas, which is also a constituent component of the drying gas, to the drying gas producing means 41 through a supply pipe 53. Also, flowrate controlling means, for example, a diaphragm pump 50, which feeds the IPA and which controls the flowrate of the IPA, is provided on the IPA supply pipe line 49.

The drying treatment unit 30 is comprised of a drying vessel 30a having a bottom opening 30B and made of quartz, the drying vessel 30a having a vertical sectional shape which is substantially like an inverted U, and a quartz made bottom plate 30b disposed so that it can close the opening 30B of the drying vessel 30a from the lower side thereof. A seal member 36 is disposed at a portion wherein the drying vessel 30a and the bottom plate 30b are adjacent to each other in order to keep the interior of the treating chamber 30A gastight. Within the treating chamber 30A of the drying treatment unit 30 there is disposed a retaining member 31 for retaining thereon a plurality of, for example, fifty, wafers W which are the objects to be treated.

A discharge pipe 37 having a discharge valve 38 provided therein is connected to the bottom plate 30b so that used drying gas can be discharged. The drying gas supplying pipe line 32 passes through an upper portion of the drying vessel 30a and drying gas supplying nozzle pipe 33 is disposed on an end portion of the drying gas supplying pipe line 32 situated on an upper side of the treating chamber 30A. It is to be noted that the drying gas supplying nozzle pipe 33 may be of any type if it enables a uniform blowing of the drying gas with respect to the wafers W. As the nozzle pipe 33, there can be used, for example, a pipe having a number of nozzle openings disposed along the length thereof. It is also to be noted that the drying vessel 30a is formed so that the drying vessel 30a can be vertically and horizontally moved by an up-and-down and horizontal movement mechanism not illustrated, whereby the conveyance of the wafers W into and out of the drying vessel 30a can be performed by upwardly elevating the drying vessel 30a and then horizontally moving the same.

A heater (heating means) 34 is disposed on an outside portion of the drying vessel 30a. The heater is arranged so that the condensation of the drying gas within the treating chamber 30A is prevented by the heater 34 which heats the side wall of the drying vessel 30a up to a temperature of, for example, 50° C. or so.

An exhaust pipe 40 is connected to one portion of the side wall of the drying vessel 30a. Furthermore, on the portion of this exhaust pipe 40 outside from the drying vessel 30a there is provided a vacuum pump (pressure-reducing means) 39. The vacuum pump 39 is adjustable so as to reduce the pressure as gently as possible at the time of the start and end of the pressure-reducing treatment. By using this construction, it is possible to bring the interior of the treating chamber 30A into a state of reduced-pressure atmosphere while the drying gas is being kept supplied thereto after having been supplied into the treating chamber 30A, and it is also possible to increase the drying efficiency by making the interior of the treating chamber 30A into such a state of reduced pressure. At the time of the start and end of the pressure-reducing treatment, it is possible to suppress a rapid change in the pressure within the treating chamber 30A by reducing the pressure as gently as possible, and therefore it is possible to prevent bad effects from being exerted on the wafers W, for example, prevent a damage to the wafers.

As shown in FIG. 4, the drying gas producing unit 41 is comprised mainly of a closed vessel (mixing vessel) 42 made of quartz or the like and intended to cause the IPA and $N_2$ gas to be mixed with each other, a plurality of vaporizing dishes 43 disposed one above another within the closed vessel 42 in parallel with each other and in multiple stages so as to permit the IPA liquid to be stored therein for its vaporization, a cylindrical quartz-made hollow support column 42a for supporting these vaporizing dishes 43 in the above-described state, heaters 44 disposed respectively within the support column 42a and at the side and bottom portions of the outside part of the closed vessel 42, and heat-insulating members 45 provided in such a way as to cover the outside parts of the heaters 44. In this case, the vaporizing dishes 43 are each made of a material having an excellent heat conductivity and also a high corrosion resistance, such as stainless steel or quartz. At an upper part of the closed vessel 42, an IPA tank 48 is connected thereto through an IPA supplying pipe line 49. Furthermore, at one side of the outside part of the closed vessel 42, a nitrogen ($N_2$) gas supply source 52 is connected thereto through a $N_2$ gas supplying pipe 53. It is to be noted that a drain pipe 41a is connected to a lower part of the closed vessel 42 so as to enable the discharge of a waste liquid pooled in the closed vessel 42.

In the above described drying gas producing unit 41, the IPA 46 supplied by the pump 50 from the IPA supplying means 48 flows down from the uppermost stage vaporizing dish 43 into sequentially lower stage vaporizing dishes 43, and during this process the IPA 46 is heated by the heaters 44, whereby IPA vapor (IPA gas) is produced. In this case, the IPA 46 which has overflowed without being completely gasified sequentially flows down further into still lower stage vaporizing dishes 43 and is thereby sequentially gasified. Accordingly, by arranging the vaporizing dishes 43 in multistage, the drying gas producing unit 41 can be made small in size and the IPA can be gasified with high efficiency. In this way, the IPA vapor that has been produced in the drying gas producing unit 41 is mixed, within the closed vessel 42, with the $N_2$ that is supplied from the $N_2$ gas supply source 52 to thereby produce a drying gas. At the same time, the thus-produced drying gas is conveyed to the treating chamber 30A by the $N_2$ gas in a state where the temperature thereof is maintained by the heaters 44 within a proper range of from 80 ° C. to 150 ° C., inclusive.

The IPA tank 48 is made of a material having a high chemical resistance, such as fluorine resin, and an upper portion and a lower portion thereof are connected to each other by a bypass circulation passage 47a. Furthermore, in the circulation passage 47a there are provided a circulation pump 47b and a filter 47c enabling the passage therethrough of the organic solvent such as IPA, whereby impurities such as particles that are contained in the IPA 46 stored in the IPA tank 48 can be removed. The diaphragm pump 50 is provided on the IPA supply pipe line 49 connecting the IPA tank 48 and the drying gas producing unit 41. By the diaphragm pump 50, the amount of the IPA supplied to the drying gas producing unit 41 is controlled, whereby the concentration of the IPA contained in the drying gas supplied to the treating chamber 30A can be adjusted to a proper range of, for example, from 3% to 80%, inclusive. If the IPA concentration is outside the range of from 3% to 80%, for example, under 3%, the drying ability is lowered while, on the other hand, if the IPA concentration is over 80%, an accident occurs wherein no gasification is made. On the other hand, if the IPA concentration is within the range of from 3% to 80%, inclusive, the IPA can serve to dry the wafers W.

The $N_2$ gas supply source 52 is connected to the drying gas producing unit 41 through the $N_2$ gas supplying pipe 53. On the $N_2$ gas supplying pipe 53 there are provided a flowmeter 60 enabling the control of the flowrate and a $N_2$ gas heater 51 for maintaining the $N_2$ gas at a suitable temperature. Through the operation of the $N_2$ gas heater 51, in cooperation with the heaters 44 of the drying gas producing unit 41, it is possible to control the temperature of the drying gas supplied into the treating chamber 30A to a prescribed temperature range of, for example, from 80° C. to 150° C. When the temperature of the drying gas is under 80° C., no gasification occurs while, on the other hand, when the gas temperature is over 150° C., the temperature of the wafers W becomes excessively high, giving rise to a problem that damage is caused on the wafers W. Accordingly, the gas temperature should be in the range of from 80° C. to 150° C. In this range, the drying gas can serve to dry the wafers W.

Next, a drying treatment method which uses the above-described drying treatment apparatus will be described.

First, the IPA 46 that has been supplied from the IPA tank 48 to the drying gas producing unit 41 by way of the IPA supply pipe line 49 is stored sequentially into the closed vessel 42 from the uppermost stage to the succeeding stages of the plurality of vaporizing dishes 43 disposed in multiple stages. Next, the IPA 46 is heated by the heaters 44 disposed inside the support column 42a and outside the closed vessel 42. Simultaneously, the $N_2$ gas that is maintained at a prescribed temperature by the $N_2$ heating device 51 is supplied into the closed vessel 42. As a result, the IPA vapor produced by the vaporization and the $N_2$ gas are mixed with each other to thereby produce a drying gas. In this case, the flowrate of the IPA 46 flowing through the IPA supply pipe line 49 is adjusted beforehand by the diaphragm pump 50 so that the concentration of the IPA contained in the drying gas may fall within the range of from 3% to 80%, inclusive, and, in this state, the IPA is supplied from the IPA tank 48 to the interior of the closed vessel 42. It is to be noted that during this period of time the wafers W that have been subjected to the cleaning treatment is conveyed into the drying treating part 30 and is kept on standby.

The thus-produced drying gas is further heated by the heaters 44 up to a temperature from 80° C. to 150° C. and then is sent into the treating chamber 30A through the drying gas supplying pipe line 32. Then, the drying gas is supplied from the nozzles of the drying gas supplying nozzle pipe 33 with respect to the wafers W and is thereby caused to contact with the wafers W to dry these wafers. In a state where the drying chamber 30 is interiorly filled with the drying gas to some extent, the vacuum pump 39 is operated to thereby start the pressure reduction in the interior of the treating chamber 30A as gently as possible. Even thereafter, the pressure reduction continues to be performed while supplying the drying gas, so as to maintain the interior of the treating chamber 30A at a prescribed low-pressure. As a result of this, the drying efficiency can be increased. After completion of the drying treatment, the vacuum pump is stopped for the purpose of restoring the pressure in the treating chamber 30A to the original level. Since as mentioned above the interior of the treating chamber 30A is pressure-reduced and pressurized as gently as possible, it is possible to suppress the damage caused to the wafers W. After the interior of the treating chamber 30A has been returned to the original pressure level, the used drying gas is discharged from the discharge pipe 37 connected to the bottom plate 30b of the drying treatment unit 30.

Since the drying gas producing unit 41 and the drying treatment unit 30 are located at positions that are different from each other, the influence of the internal state of the drying treatment unit 30 upon the state of the drying gas is reduced. In addition, since the amount of the IPA supplied to the drying gas producing unit 41 can be controlled by the diaphragm pump 50, the concentration of the IPA contained in the drying gas can be adjusted to a value within the proper range of from 3% to 80%, inclusive. Furthermore, through the heaters 44 provided with respect to the drying gas producing unit 41, the temperature of the drying gas can be adjusted to a value within the proper range of from 80° C. to 150° C., inclusive. Further, through the heater 34 provided at the side portion of the drying treatment unit 30, it is possible to prevent the drying gas within the drying treatment unit 30 from having its heat taken away by the wafers W and being thereby condensed. Moreover, since the vacuum pump 39 is connected to the drying treatment unit 30 and further the interior thereof can be reduced in pressure as gently as possible at the time of the start and end of the pressure-reducing treatment, the pressure reduction can be effected without damaging the wafers W. Furthermore, since the boiling point of a rinsing liquid adhered to the wafers W such as pure water can be lowered, the rinsing liquid can be easily gasified, with the result that the drying time can be shortened. Accordingly, the drying efficiency can be increased and further the amount of consumption of the IPA can be decreased. If only $N_2$ gas is supplied into the treating chamber 30A after the drying treatment operation, the drying gas in the treating chamber can be discharged out of the treating chamber.

Second Embodiment

Figure 5:
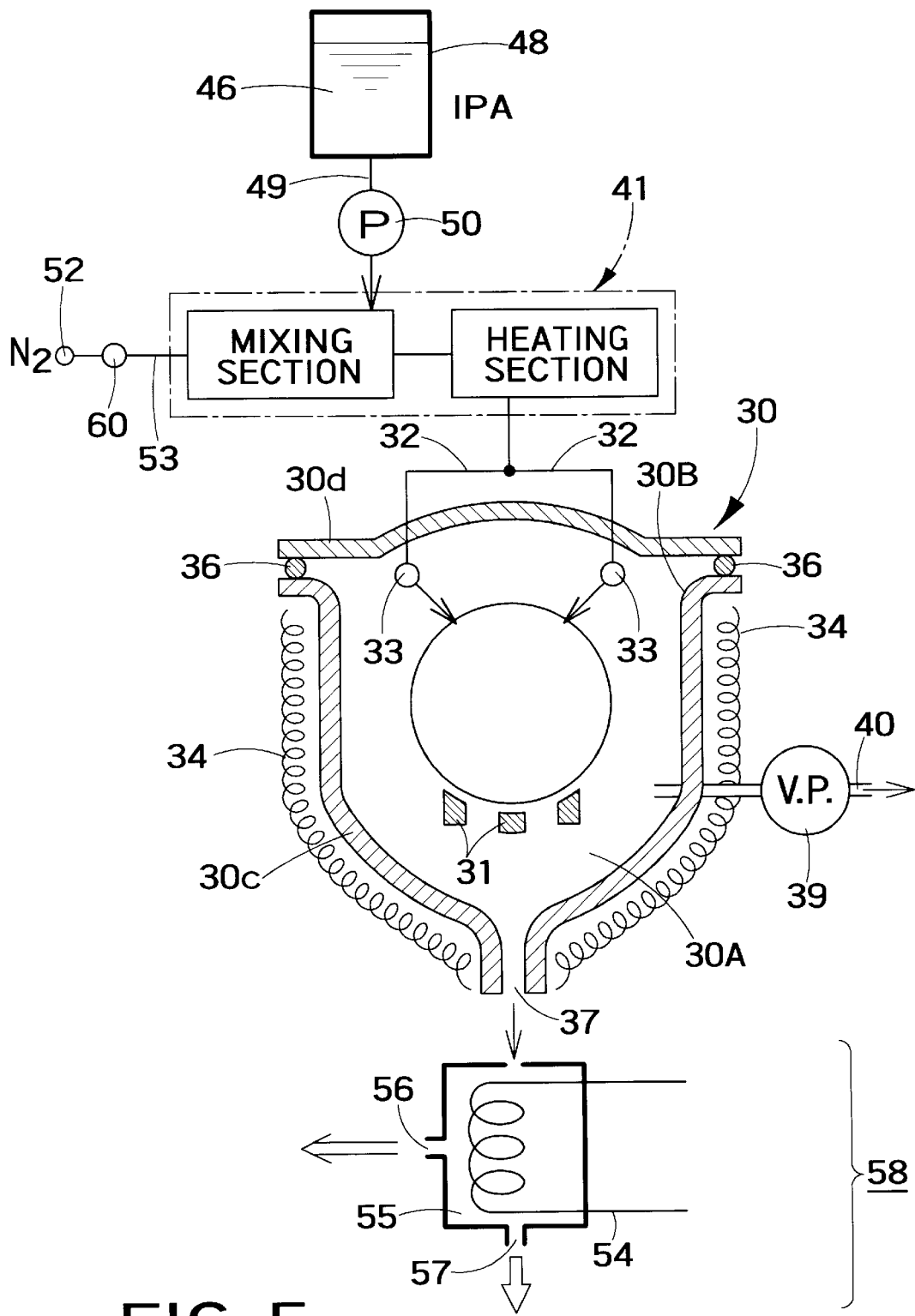
FIG. 5 is a schematic view illustrating a second embodiment of the drying treatment apparatus according to the present invention.

FIG. 5 is a schematic view illustrating a second embodiment of the drying treatment apparatus according to the present invention.

The second embodiment is directed to a case where a gas/liquid separation unit 58 is provided for enabling the separation of the used drying gas into an IPA liquid and $N_2$ gas. The gas/liquid separation unit 58 is connected to a discharge pipe 37 connected to a lower portion of a drying treatment unit 30. The drying treatment unit 30 is comprised of a drying vessel 30*c* made of, for example, quartz and having a substantially U-shaped sectional shape, a lid member 30*d* made of, for example, quartz and capable of closing an upper opening portion 30B of the drying vessel 30*c*. The lid member 30*d* is formed so that it can be opened and closed so as to enable the wafers W to be conveyed into and out of the drying vessel 30*c*. At a portion adjacent to the drying vessel 30*c*, a seal member 36 is disposed so that when the lid member 30*d* is closed, a treating chamber 30A is interiorly kept gastight. A drying gas supplying pipe line 32 connecting a drying gas producing unit 41 and the drying treatment unit 30 is branched midway into two pipe lines, and, within the treatment chamber 30A, drying gas supplying nozzles 33 and 33 are connected to the ends of these pipe lines, respectively. Thus, it is possible to cause the drying gas to contact with the wafers W more uniformly and over an enlarged area, whereby the drying efficiency can be increased.

The gas/liquid separation unit 58 is comprised mainly of a chamber 55 for receiving the used drying gas, cooling means such as a cooling coil 54 for condensing the IPA gas, an exhaust port 56 provided in the side wall of the chamber 55 and intended to exhaust the separated $N_2$ gas, and a drain port 57 provided in the bottom of the chamber 55 and intended to drain the liquefied IPA. As a result, the IPA vapor contained in the used drying gas discharged from the drain pipe 37 is cooled down to a temperature lower than the boiling point by the cooling coil 54 within the chamber 55 and therefore is condensed into liquid which in turn is discharged from the drain port 57. On the other hand, the separated $N_2$ gas is discharged from the exhaust port 56.

The gas/liquid separation unit 58 may be constructed in any manner if it has the above-described function. For example, the cooling coil 54 may be made hollow so as to permit a refrigerant to flow through the interior thereof, or may be one which utilizes the Peltier effect. Furthermore, the configuration of the gas/liquid separation unit 58 may be like a sheet and need not be of a coil type if it provides a high cooling efficiency.

Because in the second embodiment the other constituent elements thereof are the same as those in the above-described first embodiment, similar elements are denoted by like reference symbols and the explanation thereof is omitted.

By constructing as described above, the IPA which is a harmful organic solvent is recovered and then the $N_2$ gas is exhausted. Therefore, it is possible to prevent the pollution of the atmospheric environment. Furthermore, with the use of the two drying gas supplying nozzles 33 and 33 it is possible to cause the drying gas to contact with the wafers W more uniformly and over an enlarged area, whereby the drying efficiency is increased and therefore the drying time is shortened.

Third Embodiment

Figure 6:
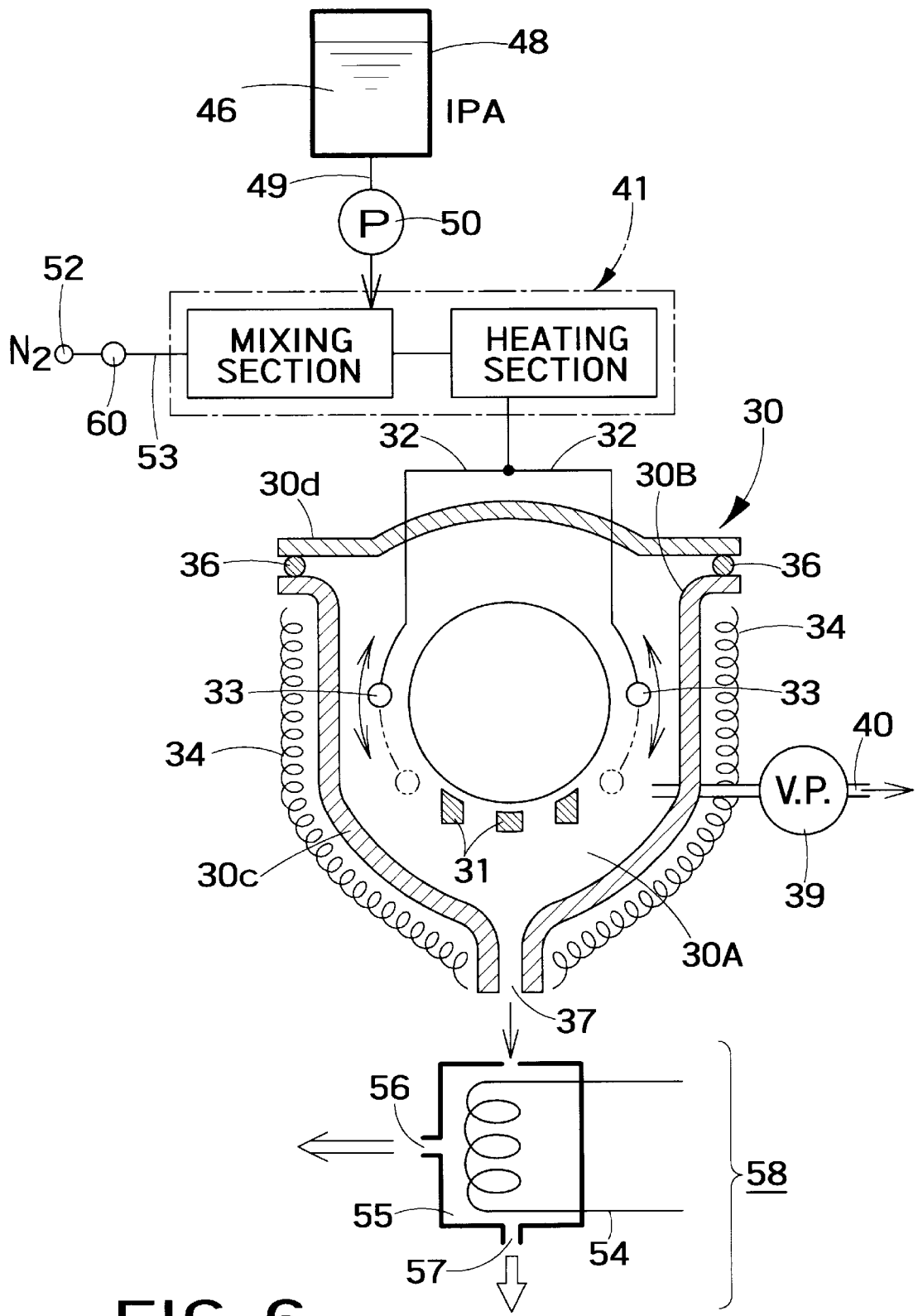
FIG. 6 is a schematic view illustrating a third embodiment of the drying treatment apparatus according to the present invention.
Figure 7:
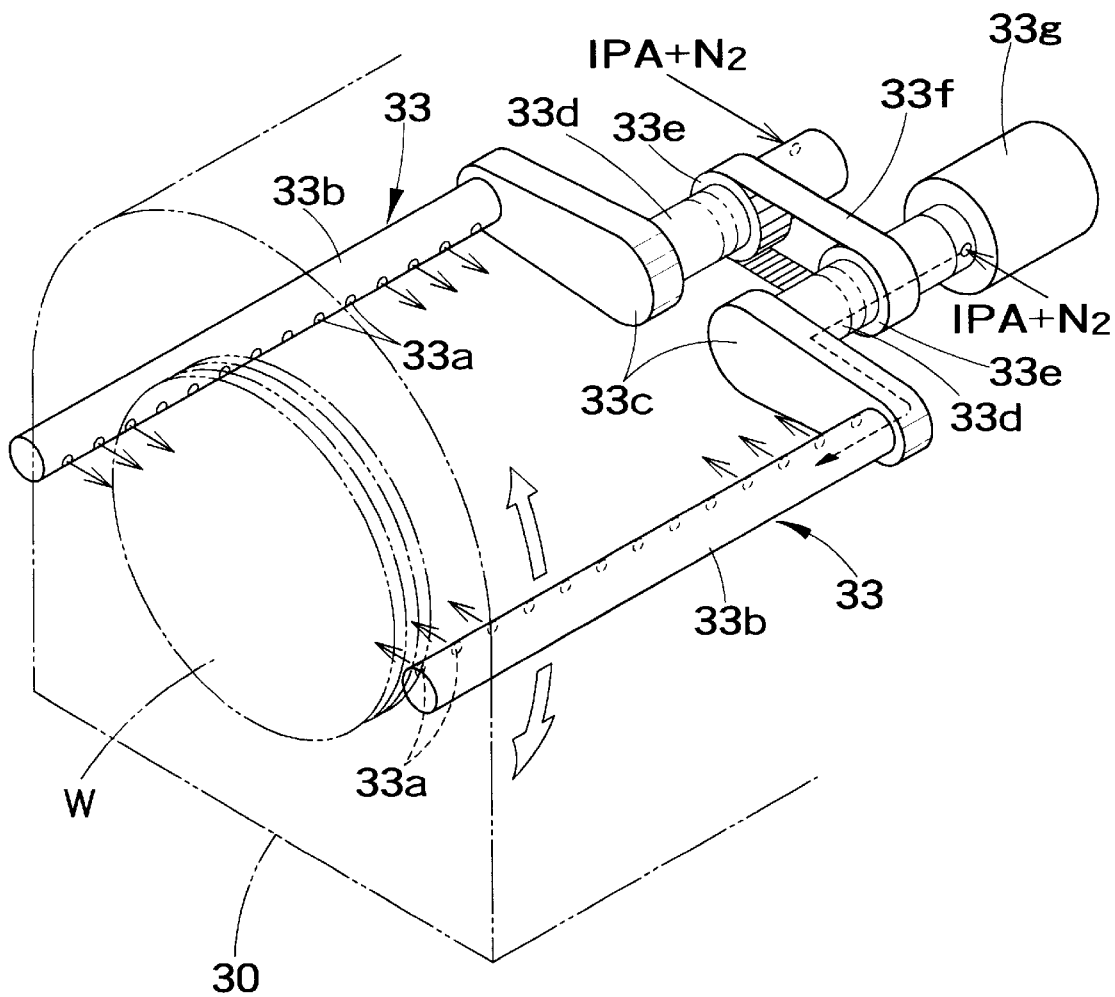
FIG. 7 is a perspective view on an enlarged scale, showing a main part of FIG. 6.

FIG. 6 is a schematic view illustrating a third embodiment of the drying treatment apparatus according to the present invention, and FIG. 7 is a perspective view of a main part of FIG. 6.

The third embodiment is directed to a case where two drying gas supplying nozzle pipes 33 and 33 are movable with respect to the wafers W. In this case, as illustrated in FIG. 7, the two drying gas supplying nozzle pipes 33 and 33 each formed of a pipe 33*b* having a plurality of nozzle openings 33*a* are respectively connected to the same sides of one ends of two swingable links 33*c* and 33*c*. Rotatary shafts 33*d* and 33*d* are respectively connected to the opposite sides of the other ends of the swingable links 33*c* and 33*c*. The rotatary shafts 33*d* and 33*d* have pulleys 33*e* and 33*e* respectively provided thereon and are arranged so as to be interlocked with each other by means of a timing belt 33*f*. An end of one of the two rotatary shafts 33*d* is connected to a reversible drive motor 33*g*. The rotation of the drive motor 33*g* is transmitted to the other rotatary shaft through the timing belt 33*f* and therefore the drying gas supplying nozzle pipes 33 and 33 are reciprocatingly movable along circular arcs symmetrical about the center of a circle whose circumference includes the nozzle pipes 33 and 33.

It is to be noted that since in the third embodiment the other constituent elements thereof are the same as those in the above-described first and second embodiments, similar elements are denoted by like reference symbols and the explanation thereof is omitted.

Since the drying gas supplying nozzle pipes 33 and 33 are reciprocatingly moved while ejecting the drying gas, the drying gas can be blown off toward the wafers W more uniformly, with the result that drying non-uniformity can be prevented from occurring and simultaneously the drying efficiency can be increased.

Other Embodiments

The respective constituent members included in each of the above-described embodiments can be used not only in the corresponding embodiment but also in the other embodiments as well. For example, the drying gas supplying nozzle pipe 33 of the first embodiment may be provided additionally, for example, to provide two or more nozzle pipes in the case of the second embodiment. Furthermore, such nozzle pipes 33 may be movably formed as in the case of the third embodiment. Moreover, the gas/liquid separation means 58 may be applied to the first embodiment. Furthermore, the configuration of the drying treatment unit 30 may be exchanged between the first embodiment and the second or third embodiment.

The bottom plate 30*b* of the drying treatment unit 30 of the first embodiment may be formed into a shutter type and thereby made openable and closable and, in addition, the retaining members 31 located within the treating chamber 30A may be formed horizontally and/or vertically movably, thereby enabling the conveyance of the wafers W to and from under the drying treatment chamber 30.

Although in each of the above-described embodiments an explanation has been given of the case where the drying gas producing unit 41 has the mixing means of the IPA and $N_2$ gas, and the heating means provided therein integrally with each other, the drying gas producing unit need not necessarily be made into such structure. For example, the drying gas producing unit may be formed into a structure wherein the mixing means of IPA and $N_2$ gas and the heating means are provided separately from each other.

While in each of the above-described embodiments an explanation has been given of the case where the drying treatment apparatus of the present invention is applied to a semiconductor wafer cleaning treatment system, this drying treatment apparatus can of course be applied to other treatment systems than the cleaning treatment system. And furthermore the drying treatment system can of course be applied also to, for example, the drying treatment of an LCD other than a semiconductor wafer.

Example

Next, an explanation will be given of a practical example wherein changes of the dried states of wafers W are observed and evaluated in relation to changes of the concentration of the IPA contained in the drying gas and the temperature of the drying gas, with reference to Table 1 below.

The dried states of the wafers W were observed and investigated after a prescribed time length elapsed from the start of the drying treatment thereof, by suitably changing the temperature of the drying gas and the concentration of the IPA contained in the drying gas, the results being shown in Table 1 below.

TABLE 1

| | Concentration Of IPA Contained In Drying Gas (%) | | | | | | | | | |
|---|---|---|---|---|---|---|---|---|---|---|
| (*) | 0% | 3% | 10% | 20% | 30% | 40% | 50% | 60% | 70% | 80% |
| 50° C. | X | X | X | X | X | X | X | X | X | X |
| 70° C. | X | X | X | X | Δ | Δ | Δ | Δ | Δ | Δ |
| 80° C. | X | o | o | o | o | o | o | o | o | o |
| 100° C. | X | o | o | o | o | o | o | o | o | o |
| 120° C. | Δ | o | o | o | o | o | o | o | o | o |
| 150° C. | Δ | o | o | o | o | o | o | o | o | o |
| 170° C. | Δ | o | o | o | o | o | o | o | o | o | o: good,
Δ: partly not dried,
X: not dried
(*): Temperature Of Drying Gas (° C.)

As a result of the tests, as seen in Table 1, in a region wherein the temperature of the drying gas is from 80° C. to 170° C., inclusive, and the concentration of the IPA contained in the drying gas is from 3% to 80%, inclusive, the dried states of the wafers W were evaluated as being good in regard to all the tests.

It is to be noted that the reason why the upper limit of the IPA concentration has been set to 80% is that when the IPA concentration is over 80%, the IPA is likely to be blown out in the form of a liquid and this liquid causes the occurrence of non-uniform dryness. While according to Table 1 it is seen that with regard to the temperature of the drying gas the range of from 80° C. to 170° C., inclusive, is good, this result concerns a case where attention was paid to only the dried states of the wafers W. When the temperature of the drying gas is over 150° C., damages due to heat on the wafers W increases and so this range of over 150° C. is not desirable.

Accordingly, it has been determined that the range in which a good drying treatment is carried out, regarding the temperature of the drying gas and the concentration of the IPA contained in the drying gas, should be set such that the temperature of the drying gas is from 80° C. to 150° C., inclusive, and the IPA concentration is from 3% to 80%, inclusive.

As has been described above, the dry treatment method and dry treatment apparatus of the present invention are constructed as described above and therefore have the following excellent advantages. That is, the drying gas producing means and the drying treatment means are located in areas that are different from each other, and therefore it is possible to lessen the influence on the drying gas, by the respective states of the object to be treated and the interior of the drying treatment means. In addition, by controlling the amount of the solvent supplied from the solvent supplying means by flowrate controlling means, the concentration of the IPA contained in the drying gas can be controlled to a value within the suitable range of from 3% to 80%, inclusive and, also, the temperature of the drying gas can be controlled to a value within the suitable range of from 80° C. to 150° C., inclusive, by the heating means. Accordingly, it is possible to increase the drying efficiency, to make effective use of the drying gas and the solvent, and to reduce the amount of consumption of the solvent.

What is claimed is:

1. A drying treatment method comprising the steps of:
    supplying a solvent at a controlled flowrate:
    supplying an inert gas at a controlled flowrate:
    mixing and heating said solvent and said inert gas to produce a drying gas having a solvent concentration in a range of three percent to eighty percent and having a temperature of 80 degrees Celsius to 150 degrees Celsius; and
    supplying said drying gas into a drying treatment chamber and causing the drying gas to contact an object to be treated, said object contained in the drying treatment chamber, to dry the object.

2. The drying treatment method according to claim 1, further comprising the step of:
    reducing the pressure in said drying treatment chamber after said step of supplying said drying gas into the drying treatment chamber to dry the object.

3. A drying treatment apparatus comprising:
    drying treatment means having a drying treatment chamber containing an object to be treated;
    a solvent supply source;
    an inert gas supply source;
    drying gas producing means including a mixing unit for mixing a solvent and an inert gas to obtain a mixed gas having a specific solvent concentration, and a heating unit for receiving and heating the mixed gas to produce a drying gas of a specific temperature;
    a solvent supply pipe line connecting said solvent supply source to said mixing unit;
    a flowrate-controllable solvent feed means provided in said solvent supply pipe line;
    an inert gas supply pipe line connecting said inert gas supply source to said mixing unit;
    a drying gas supply pipe line connecting said drying gas producing means to said drying treatment chamber to send the drying gas into the drying treatment chamber;
    said solvent feed means being set to produce such a flowrate of the solvent which causes said solvent concentration in the drying gas to be maintained in a rage of three percent to eighty percent; and said heating unit being set to maintain said specific temperature of the drying gas in a range of 80 degrees Celsius to 150 degrees Celsius.

4. The drying treatment apparatus according to claim 3, further comprising:

a drying gas supply nozzle provided to said drying gas supply pipe line and disposed in said drying treatment chamber.

5. The drying treatment apparatus according to claim 4, wherein:

said drying gas supply nozzle is movably provided relative to the object to be treated.

6. The drying treatment apparatus according to claim 3, further comprising:

an exhaust pipe connected to said drying treatment chamber; and an exhaust means provided in the exhaust pipe, to reduce a pressure of the drying treatment chamber.

7. The drying treatment apparatus according to claim 3, further comprising:

heating means provided outside of the drying treatment chamber, for preventing condensation of the drying gas within the drying treatment chamber.

8. The drying treatment apparatus according to claim 3, further comprising:

a discharge pipe connected to said drying treatment chamber; and a gas/liquid separation unit provided to the discharge pipe, to separate the solvent in a used drying gas from the inert gas.

9. The drying treatment apparatus according to claim 8, wherein said gas/liquid separation unit comprises:

a drying gas chamber for receiving a used drying gas;

cooling means for condensing the solvent contained in the drying gas;

a solvent discharge port provided at a bottom of said drying gas chamber to discharge the condensed solvent; and an inert gas exhaust port provided at said drying gas chamber to discharge the separated inert gas.

10. The drying treatment apparatus according to claim 3, wherein:

said solvent feed means comprises a diaphragm pump.

11. The drying treatment apparatus according to claim 3, wherein said mixing unit comprises:

solvent vaporizing dishes disposed in multistages in vertical direction; and means for supplying the solvent into the uppermost one of said dishes.

* * * * *